United States Patent [19]

Katzmann et al.

[11] 4,000,463
[45] Dec. 28, 1976

[54] DIRECT-READING DECIBEL METER

[75] Inventors: Fred L. Katzmann, Cedar Grove; Archie J. Harrison, Jr., Mt. Arlington, both of N.J.

[73] Assignee: Ballantine Laboratories, Inc., Boonton, N.J.

[22] Filed: Dec. 1, 1975

[21] Appl. No.: 636,632

[52] U.S. Cl. .............................. 324/132; 324/115; 324/140 D; 328/145
[51] Int. Cl.² ................. G01R 15/10; G01R 15/08
[58] Field of Search .......... 324/132, 140 D, 140 R, 324/115, 99 D; 328/145, 143

[56] References Cited

UNITED STATES PATENTS 3,159,787   12/1964   Sexton et al. ................ 324/132
3,828,255   8/1974   Schudn ....................... 328/145

Primary Examiner—Palmer C. Demeo
Assistant Examiner—Ernest F. Karlsen
Attorney, Agent, or Firm—Davis, Hoxie, Faithfull & Hapgood

[57] ABSTRACT

A digital display electronic meter apparatus is disclosed which is capable of displaying amplitude ratio measurements directly in decibels over its entire amplitude operating range.

11 Claims, 3 Drawing Figures

DIRECT-READING DECIBEL METER

The present invention is a new digital display electronic meter which is capable of displaying amplitude ratio measurements directly on a decibel scale over its entire amplitude range.

In the past, analog meters either has several scales printed adjacent one another for the various ranges of operation, or the meter operator was required to make a mental calculation depending upon both the meter needle location on the scale and the range setting of the meter in order to determine the value indicated. Typically, a pair of scales with full scale values of 3 and 10, respectively, were employed for direct reading of amplitudes such as voltage or current. The range switch position indicated to the operator whether the "3" or "10" scales were to be read and by what factor of ten the scale reading should be multiplied to determine the measured value. Similarly, a separate adjacent scale was often employed for decibels (dB), with a typical scale being marked −20 dB to +3 dB. The range switch position indicated to the operator the factor of 10 to be added to the scale reading to compute the measured value in decibels.

Digital display meters eliminated the mental step of multiplying the readings of voltage and current scale readings. The range switch on such meters usually provides voltage and current increments in factors of ten, which are well suited to direct readings by adjustment of the decimal point in accordance with the range switch position. This technique of moving the decimal point is not applicable to range adjustment on a decibel scale in digital meters. In terms of decibels, a factor of 10 volts is represented by 20 decibels. Thus, for the decibel scale to be direct reading, the display must be changed by 20 decibels for each factor of 10 change in the meter range. The dB (decibel) option for one digital voltmeter now available on the market, the Hewlett Packard Model 3403, does provide for such a change in the decibel display. It does so in a relatively complex fashion as compared with the present invention, by incorporating a digital integrated circuit into the display section of the meter. Signals from the range switching circuits command an adder chip in the integrated circuit to add or subtract pulses to the pulses representative of the measured value, all of which are then counted in the conventional fashion and determine the value displayed.

While the embodiment described in detail herein is a direct-reading decibel scale voltmeter, the invention also contemplates the application of the same concept to direct-reading decibel meters of other types, including ammeters and wattmeters.

Figure 1:
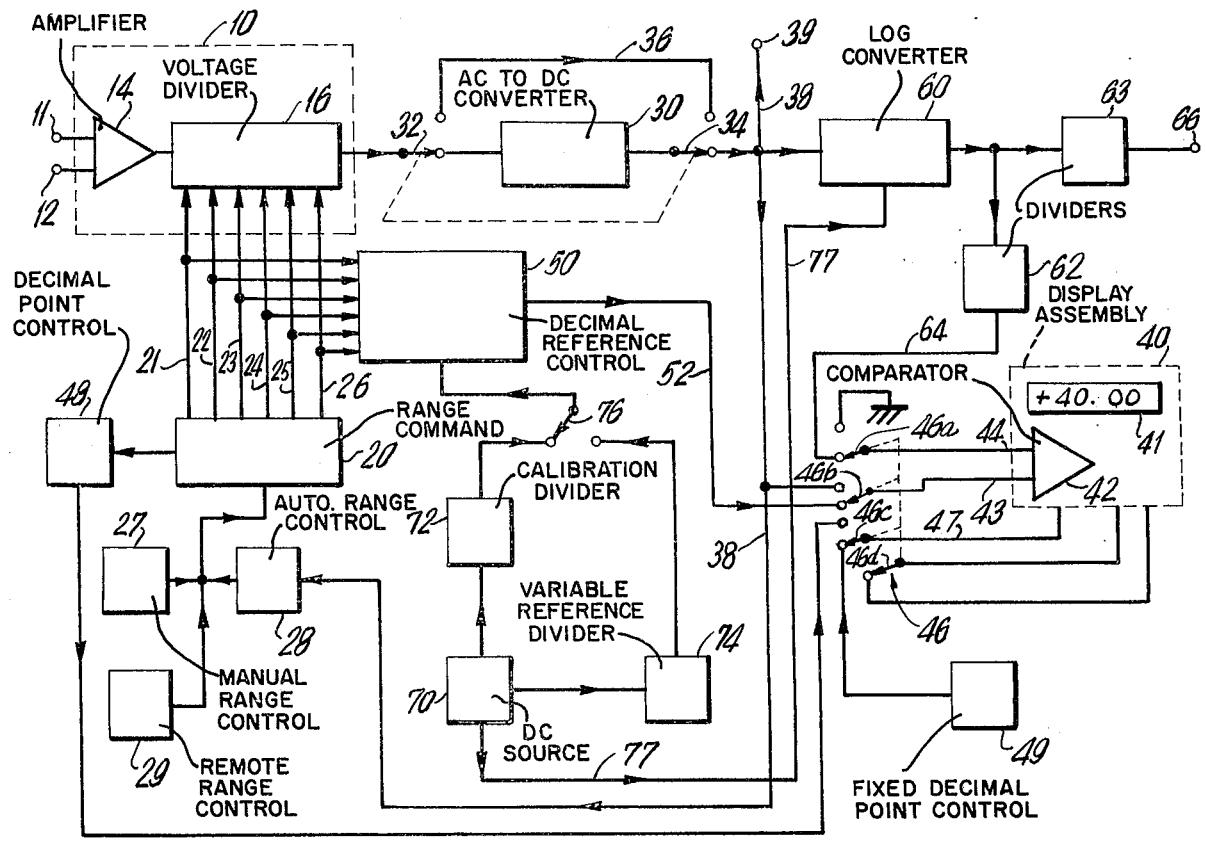
FIG. 1 is a schematic block diagram of an embodiment of the apparatus of the present invention.

FIG. 1 shows the schematic block diagram of a digital voltmeter which directly displays measurements in volts or decibels with respect to a reference. The input signal to be measured is received at input terminals 11 and 12 of a signal amplifier 14 within a signal adjusting means 10. The signal adjusting means 10 amplifies the received signal linearly by a fixed factor determined by a signal on one of leads 21 through 26 from a range command circuit 20, which controls the resistance ratio of a voltage divider 16 within the signal adjusting means 10. The signal adjusting means 10 may provide other signal conditioning functions, such as compensation for the frequency characteristics of a test probe. Alternatively, a voltage divider alone or a variable gain amplifier or other conventional means may be used for the signal adjusting means 10. The range command circuit 20 is controlled by a manual range control 27 or an automatic range control 28 or a remote range control 29 in a conventional fashion. In this particular embodiment, a signal on one of the leads 21 through 26 from the range command circuit 20 indicates a choice of range as follows:

TABLE I

| Lead | Volts Full Scale | dB Full Scale | Voltage at 52 |
|------|------------------|---------------|---------------|
| 21 | 10mV | −40dB | −.2V |
| 22 | 100mV | −20dB | −0V |
| 23 | 1V | 0dB | +.2V |
| 24 | 10V | +20dB | +.4V |
| 25 | 100V | +40dB | +.6V |
| 26 | 1000V | +60dB | +.8V |

The voltage at 52 is the output on lead 52 of decibel reference control 50, which is discussed below in connection with the decibel measurement mode.

The adjusted amplitude signal from the signal adjusting means 10 is either passed through an AC to DC converter 30 via switches 32 and 34, in the case of an AC signal, or may be bypassed around the converter 30 via switches 32 and 34 and lead 36, in the case of a DC signal. A root mean square (RMS) type AC to DC converter which will also pass direct current, eliminating the need for switches 32 and 34 and lead 36, is preferred. Regardless of the value of the input signal received at terminals 11 and 12, when the range command 20 is properly set, the amplitude of the signal at the output of the AC to DC converter 30 (or lead 36) for an input signal at the top of the range is a predetermined value, typically 1.95 volts.

When the apparatus of FIG. 1 is operated as a digital voltmeter, rather than as a decibel meter, the adjusted amplitude signal form of the converter 30 (or from lead 36 in the case of a DC signal) is applied to the "high" input terminal 43 of the display assembly 40 via switch 46b and the "low" input terminal 44 of the display assembly 40 is connected to ground by switch 46a which is electrically ganged with switches 46b, 46c and 46d. The display assembly 40 may be a TA 310 series digital panel meter having a liquid crystal display, manufactured by Tekelec, Inc., or other digital panel meter. In the apparatus of FIG. 1 employing the TA 310 series digital panel meter as the display assembly 40, the analog signal received at input terminals 43 and 44 of a comparator 42 is converted to a digital signal, the pulses of the digital signal are then counted over a fixed period and the result of the count is displayed on a liquid crystal display 41. The display 41 is of the 4 ½ digit variety, in which the largest number which can be displayed is 19999 (the highest order digit being referred to as a ½ digit, since that position is limited to display of a "1" or no display).

The adjusted amplitude signal from the AC to DC converter 30 (or from lead 36) is also applied via lead 38 to the input of the auto-range control 28. When the auto-range control 28 senses that the voltage on lead 38 is less than 0.1 volt, it causes the range command 20 to switch down one range at a time until the voltage on lead 38 is in excess of 0.1 volt. Similarly, if auto-range control 28 senses that the voltage on lead 38 exceeds 1.95 volts, it causes the range command 20 to switch up one range at a time until the voltage on lead 38 is below 1.95 volts. These functions are performed by the auto-range control 28 and the range command 20 in a conventional fashion. Lead 38 is also connected to terminal 39 to provide a DC output referenced to 2 volt nominal full scale from the AC to DC converter 30.

The range command 20 also controls a decimal point control 48, which is connected in the voltage mode to the display assembly 40 in switch 46c and determines the location of the decimal point on display 41.

The automatic polarity indication of the display assembly 40 is disabled in the AC voltage mode, and is reintroduced by external switching (represented in FIG. 1 by switch 46d) for the decibel mode.

When the switch 46 is switched from the position for direct voltage measurements as just described to the position shown in FIG. 1, the apparatus of FIG. 1 is connected for direct display of decibels. In this mode, the signal from the AC to DC converter 30 (or from lead 36) is disconnected from the "high" input terminal 43 of the display assembly 40. The output of the decibel reference control 50 is connected by lead 52 to the display assembly 40 through switch 46b and line 43. The decibel reference control 50 produces a voltage output on lead 52 which ranges from −0.2 volt to +0.8 volt in a 0.2 volt increments in response to an input of a signal indicative of the range selected on one of leads 21 through 26 from range command 20. The voltages produced on lead 52 by decibel reference control 50 in response to signals on particular leads 21 through 26 are indicated in Table I, above.

In the decibel mode, the decimal point which is activated in the display 41 is fixed between the second and third digits from the right by a signal from a fixed decimal point control 49 via switch 46c, and the decimal point remains fixed regardless of range setting. In this mode, the plus and minus indications are not determined by the display assembly 40 in the usual manner of the Tekelec Model 310, because the signal to be measured from the log converter 60 and 5:1 divider 62 is connected to input 44, which is grounded in the voltage mode, and the decibel reference voltage is connected to input 43.

Figure 3:
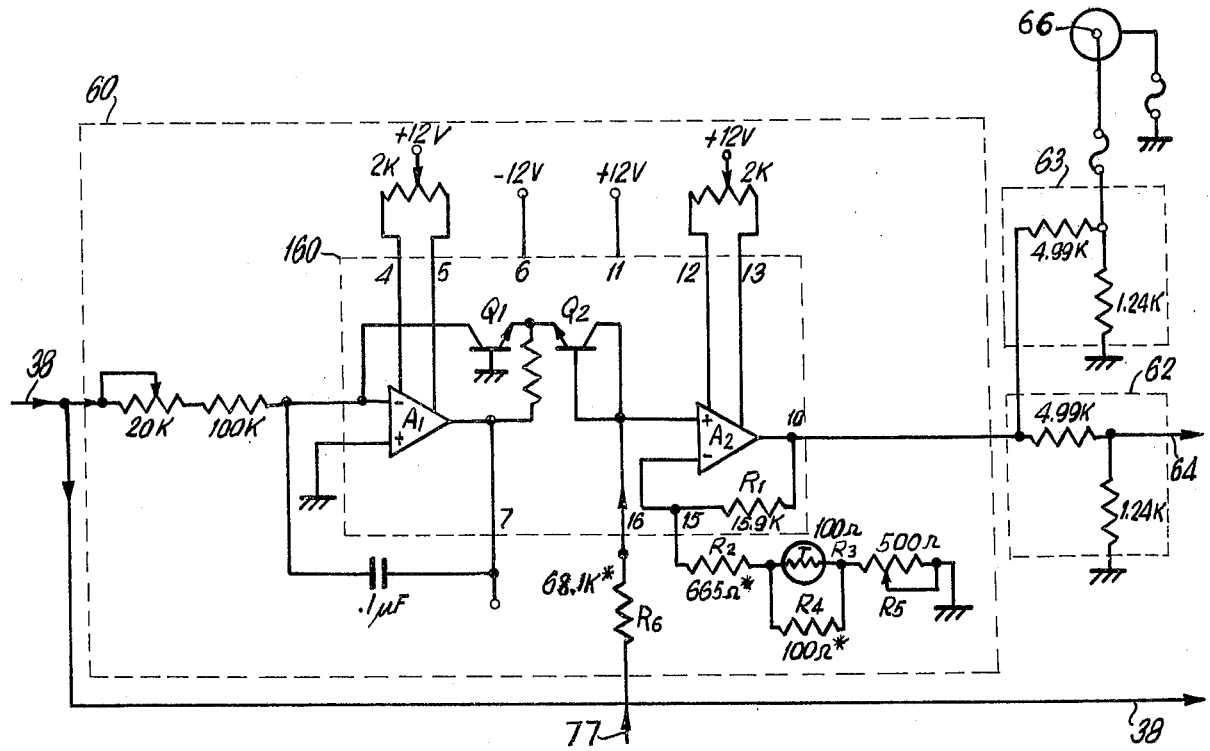
FIG. 3 is a schematic diagram of the logarithmic converter and associated circuits of the embodiment of FIG. 1.
Figure 2:
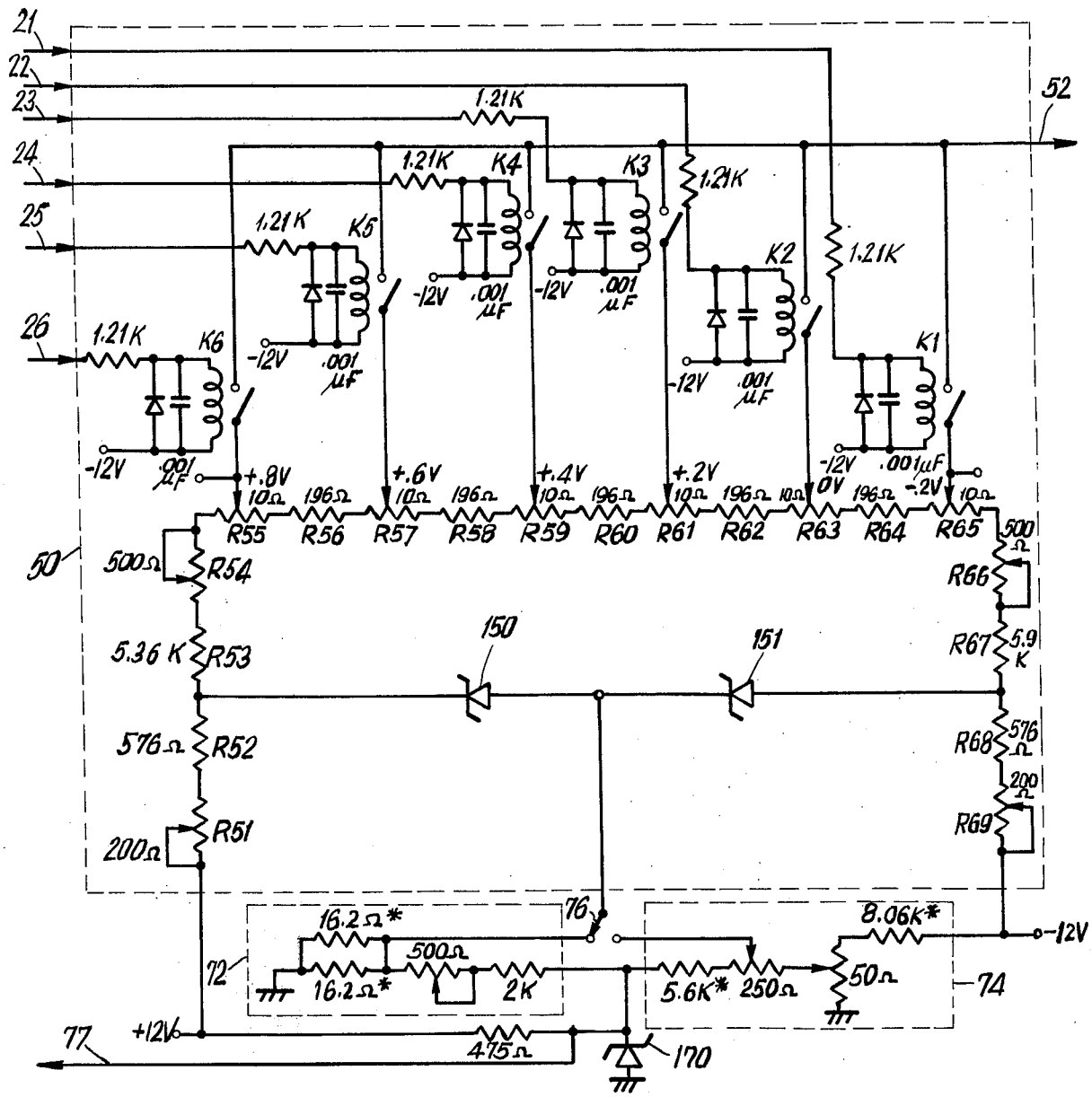
FIG. 2 is a schematic diagram of the decibel reference control and associated circuits of the embodiment of FIG. 1.

FIG. 2 shows the decibel reference control 50 as well as a calibration divider 72 and a variable reference divider 74, each of which is an adjustable power source, in particular, a voltage source. Zener diode 170, which maintains a voltage of 6.2 volts, serves as the stable source of DC power or reference 70 for these dividers as well as for the logarithmic converter 60 to which it is connected by lead 77. The nominal values of the various circuit components are shown in FIGS. 2 and 3. The asterix "*" in these figures indicates a component whose value is specially selected during the factory calibration of the instrument.

The decibel reference control 50 provides the reference value via lead 52 to input 43 of the display assembly 40 for use in decibel measurements. The decibel reference voltages are derived from the DC source 70 either via the calibration divider 72 or the variable reference divider 74 as selected by a front panel switch 76. The calibration divider 72 is intended for internal adjustment in the range from 0 dB = 1mW/1000 Ω to 0 dB = 1mW/35 Ω. The variable reference divider 74 is adjustable from the front panel over a range of 17 dB and provides for temporary calibration of the instrument to a dB reference level other than that internally set with the calibration divider 72.

The calibration divider 72 is an adjustable divider network connected between the +6.2 volt output of Zener diode 170 and signal ground. As shown in FIG. 2, the calibration divider 72 is designed for a reference of 1 milliwatt into a 600 ohm load. The variable reference divider 74 is an adjustable divider network connected between the +6.2 volt output of Zener diode 170 and the −12 volt power terminal.

The pole of switch 76 is connected to the mid-point of series connected Zener diodes 150 and 151. Like Zener diode 170, these Zener diodes 150 and 151 each establish a potential drop of 6.2 volts. Type 1N825A Zener diodes were used in the embodiment described here. Zener diodes 150 and 151 establish the reference voltages for the resistor divider R51 through R69 of decibel reference control 50. The individual reference voltages, having nominal values of +0.8, +0.6, +0.4, +0.2, 0 and −0.2 are established at the adjustable contacts of the 10 ohm potentiometers R55, R57, R59, R61, R63, and R65.

Range command 20 provides a signal through one of leads 21 through 26 to the decibel reference control 50 which determines which of the reference voltages from potentiometers R55, R57, R59, R61, R63, or R65 will be connected to the output lead 52. Each of the leads 21 through 26 is connected to one of the relay coils K1 through K6, respectively. When a signal is received on one of the leads 21 through 26, the coil of the corresponding relay of K1 through K6 is activated, closing that relay's contacts and connecting a reference voltage to the output lead 52. Since the leads 21 through 26 from the range control 20 control both the amplitude adjustment of amplitude adjusting means 10 and the reference voltage adjustment of decibel reference command 50, the range control 20 synchronizes these elements. In a simpler embodiment, a mechanical coupling may serve to connect switches and thereby synchronize these elements.

When switch 46 has been switched to the decibel mode and lead 38 is no longer connected to the display assembly 40, the logarithmic converter 60 comes into use. FIG. 3 shows detailed schematic diagrams of the logarithmic converter 60, a 5:1 divider 62 and a 5:1 divider 63. The logarithmic converter 60 includes a monolithic log amplifier 160, such as Model 8048 manufactured by Intersil. The Model 8048 log amplifier is fully temperature compensated and normally provides 1 volt of output on a logarithmic basis for each decade change of input voltage (or current) over as many as three decades. In the present apparatus, however, log converter 60 is normally utilized over only a little over one decade of input voltage, thereby reducing linearity tracking errors to a minimum. The log converter 60 is driven by the DC signal on lead 38 which, when the range of the meter is properly set, has an amplitude between 100mV and 2 volts. The output of the log converter 60 is calibrated at 1 volt for a 1 volt input signal. When the drive voltage is decreased to 0.100V, the output rises to 2 volts. To provide direct correlation of the output voltage of the log converter 60 with the decibel scale, the output signal from the log converter 60 is divided by the 5:1 divider 62. The output of the divider 62 on lead 64 is then described by the function $$E = +.2V - \frac{LOG(E_{in})}{5}$$

where $E_{in}$ is the input to the log converter 60 on lead 38. As a result, a decade change in the input to the log converter 60 is represented by a 0.200V logarithmic change on lead 64 from divider 62. The signal from lead 64 is applied via switch 46a to the "low" input 44 of display assembly 40. Concurrently, the signal on lead 52 from the decibel reference control 50 is applied to the "high" input 43 of the display assembly 40. The display 41 indicates the amplitude difference between the signals on display assembly inputs 43 and 44, and as a result directly displays the potential difference across meter inputs 11 and 12 in decibels. Some typical operating examples are as follows:

TABLE II

| Input at 10 & 12 | Range Setting dB | Ref. V at 52 | Log V at 64 | Display dB |
|---|---|---|---|---|
| 1000 | +60 | .8 | .2 | 60.00 |
| 500 | +60 | .8 | .2602 | 53.98 |
| 170 | +60 | .8 | .3539 | 44.61 |
| 170 | +40 | .6 | .1539 | 44.61 |
| 100 | +40 | .6 | .2 | 40.00 |
| 10 | +20 | .4 | .2 | 20.00 |
| 1 | 0 | .2 | .2 | 0.00 |
| .1 | 0 | .2 | .4 | −20.00 |
| .1 | −20 | 0 | .2 | −20.00 |
| .03 | −20 | 0 | .3046 | −30.46 |
| .01 | −40 | −.2 | .2 | −40.00 |
| .001 | −40 | −.2 | .4 | −60.00 |

The log amplifier 160 operates in its intended, conventional manner. The logarithmic function is produced as a result of the well-known exponential relationship between the collector current and the base-emitter voltage of a transistor, transistors Q1 and Q2 in this embodiment. The ratio $$\frac{R_1 + R_2 + \frac{R_3 R_4}{R_3 + R_4} + R_5}{R_2 + \frac{R_3 R_4}{R_3 + R_4} + R_5}$$

is chosen to be 16.9, in order to produce 1 volt per decade at the output. $R_1$ is a thin film resistor deposited on the monolithic chip and its temperature coefficient compensates for the temperature dependence of the transistor current. The temperature coefficient of external resistor network $R_3$, and $R_4$ is designed to provide a greater degree of temperature coefficient compensation than can be obtained from $R_1$ alone. In particular, $R_3$ has a temperature coefficient of $-2.5\Omega/°C$. The value of $R_4$ is selected during the factory calibration of the instrument to adjust the effective temperature coefficient of $R_3$ and $R_4$, to compensate for production variations in the value of $R_1$ and thereby maintain the desired ratio.

The current through $R_6$, which is connected between terminal 16 of the logarithmic amplifier 160 and the 6.2 volt reference (via lead 77) is the 0.1mA reference current required by the logarithmic amplifier 160.

The divider network 62 connected to the output of the logarithmic converter 60 linearly reduces the value of the output ratio from 1 volt per decade to 0.2 volt per decade. The output of the divider network 62 is connected via lead 64 to switch 46a and thence to the display assembly 40. A similar divider network 63 is employed to linearly reduce the value of the output ratio which is produced at logarithmic signal output terminal 66. The two divider networks 62 and 63 also serve to isolate the logarithmic output terminal 66 from the input 44 of the display assembly 40.

We claim:
1. Apparatus for the measurement of the amplitude ratio of a signal to a standard on a decibel scale comprising:
   signal input terminals,
   signal adjusting means for adjusting the amplitide of a signal received from the signal input terminals by a predetermined factor thereby producing an adjusted amplitude signal,
   a logarithmic converter arranged to receive the adjusted amplitude signal and produce a log signal having an amplitude corresponding to the logarithm of the amplitude of the adjusted amplitude signal,
   a first adjustable power source which produces a first reference signal,
   a comparator connected to receive the output of the logarithmic converter on a first comparator input and to receive the first reference signal on a second comparator input,
   means synchronizing the adjustments of the signal adjusting means and the adjustable reference signal source, and
   a linear scale amplitude display connected to receive the output of the comparator.
2. The apparatus of claim 1 wherein the predetermined factor of the signal adjusting means is one of a geometric progression of such factors by increments of ten and the adjustable reference signal divider is arranged to produce different values of the first reference signal in a corresponding linear progression by equal increments.
3. The apparatus of claim 1 further comprising a stable power source connected as a supply for the first adjustable signal source.
4. The apparatus of claim 3 further comprising a second adjustable power source, an input of which is connected to the stable power source and the output of which provides a second reference signal to the first adjustable power source.
5. The apparatus of claim 3 wherein the output signal amplitude of the logarithmic converter is dependent on ratio between the amplitude of the adjusted amplitude signal and the amplitude of a third reference signal which is dependent upon the output of the stable power source.
6. The apparatus of claim 1 further comprising an AC to DC converter connected between the signal adjusting means and the logarithmic converter.
7. The apparatus of claim 6 wherein the AC to DC converter is of the root-means-square responding type.
8. The apparatus of claim 1 wherein the signal adjusting means comprises an amplifier and a voltage divider.
9. The apparatus of claim 1 wherein the display is a digital display.
10. Apparatus according to claim 1 for the measurement of voltage on a linear scale and voltage ratios on a logarithmic scale further comprising switching means for alternatively connecting both the logarithmic con- verter output and the first reference voltage to inputs of the comparator or connecting the adjusted amplitude signal to the comparator.

11. The apparatus of claim 1 wherein the voltage of the first reference signal is defined by the formula $$E_{reference} = K(1 + \log E_{range})$$

where K is a constant and $E_{range}$ is the voltage range multiplier of the signal adjusting means.